United States Patent [19]

Furutani et al.

[11] Patent Number: 5,159,287
[45] Date of Patent: Oct. 27, 1992

[54] HIGH EFFICIENCY RF POWER AMPLIFIER

[75] Inventors: Nagahisa Furutani, Kawasaki; Kazuhiro Matsumoto, Isehara; Isao Imai, Kawasaki, all of Japan

[73] Assignees: Fujitsu Limited, Kawasaki; Fujitsu Yamanashi Electronics Limited, Yamanashi, both of Japan

[21] Appl. No.: 731,052

[22] Filed: Jul. 16, 1991

[30] Foreign Application Priority Data

Jul. 16, 1990 [JP] Japan .................................. 2-187437

[51] Int. Cl.[5] .............................................. H03F 3/60
[52] U.S. Cl. ...................................... 330/286; 330/302
[58] Field of Search ................ 330/53, 277, 286, 300, 330/302, 303, 306

[56] References Cited

U.S. PATENT DOCUMENTS

| | | | |
|---|---|---|---|
| 4,320,353 | 3/1982 | Sasaki | 330/286 |
| 4,504,796 | 3/1985 | Igarashi | 330/286 |
| 4,717,884 | 3/1988 | Mitzlaff | 330/251 |
| 4,754,229 | 6/1988 | Kawakami et al. | 330/277 |
| 4,771,247 | 9/1988 | Jacomb-Hood | 330/286 X |
| 4,890,069 | 12/1989 | Duffalo et al. | 330/302 X |

FOREIGN PATENT DOCUMENTS

| | | | |
|---|---|---|---|
| 0073911 | 6/1981 | Japan | 330/286 |
| 0284006 | 11/1989 | Japan | 330/286 |

OTHER PUBLICATIONS

Patent Abstracts of Japan, vol. 10, No. 16, (E-154) (375), 22 Jan. 1986; & JP-A-60-178710 (Nippon Denshin Denwa Kosha) 12 Sep. 1985.

Patent Abstracts of Japan, vol. 10, No. 125, (E-402) (2182), 10 May 1986; & JP-A-60-256202 (Hitachi Seisakusho) 17 Dec. 1985.

Patent Abstracts of Japan, vol. 12, No. 489, (E-696) (3336), 21 Dec. 1988; & JP-A-63-204913 (Mitsubishi Electric) 24 Aug. 1988.

*Primary Examiner*—Steven Mottola
*Attorney, Agent, or Firm*—Staas & Halsey

[57] ABSTRACT

A high efficiency RF power amplifier includes a field effect transistor having a grounded source, a gate receiving an input signal, and a drain. A first inductor has a first end coupled to the drain via a lead inductance, and a second end through which an amplified output signal is output. A first capacitor has a first end grounded and a second end coupled to the second end of the first inductor. A second inductor has a first end receiving a drain bias voltage and a second end coupled to the second end of the first inductor. The second inductor is formed of a distributed-constant element. The first capacitor and the second inductor form a parallel resonant circuit coupled to the drain at a fundamental operating frequency of the high efficiency RF power amplifier, so that the drain is set to a high-impedance state. The first inductor, the first capacitor and the lead inductance form a serial resonant circuit coupled to the drain at a second harmonic of the fundamental operating frequency, so that the drain is set to a low-impedance state.

16 Claims, 4 Drawing Sheets

HIGH EFFICIENCY RF POWER AMPLIFIER

BACKGROUND OF THE INVENTION

1. Field of the Invention

The present invention generally relates to high efficiency RF (Radio Frequency) power amplifiers, and more particularly to a high efficiency RF power amplifier having an improved circuit configuration which creates a short circuit impedance at the second harmonic of the fundamental operating frequency.

2. Description of the Prior Art

Recently, portable telephone sets or mobile radio communication devices have been practically used. These devices use a battery as a power source. A transmission power amplifier of the devices consumes approximately 75% of power supplied by the battery. Thus, it is necessary to improve the efficiency of the transmission power amplifier.

A conventional high efficiency power amplifier used in the microwave range uses a GaAs field effect transistor, as disclosed in U.S. Pat. No. 4,717,884, the disclosure of which is hereby incorporated by reference.

FIG. 1 is a circuit diagram of the high efficiency RF power amplifier disclosed in the above patent. The amplifier shown in FIG. 1 has a GaAs field effect transistor 10, which has a grounded source, a gate receiving an RF input signal, and a drain. The amplifier functions as a class F amplifier capable of efficiently amplifying input power.

At the third harmonic of the fundamental operating frequency, a parallel resonance circuit which comprises a lead inductance L1 of a bonding wire, a parasitic capacitance C1 of the GaAs FET 10, and an external inductor 11 is created, so that the drain of the GaAs FET 10 is opened (in other words, a high-impedance circuit is connected to the drain of the GaAs FET 10). In this case, a stub 12 formed of, for example, a microstrip line, has a length of $\lambda_3/4$ where $\lambda_3$ is the wavelength of the third harmonic. At the second harmonic of the fundamental operating frequency, a series resonance circuit composed of the capacitance of the stub 12, the lead inductance L1 and the external inductor 11 is created, so that the drain of the GaAs FET 10 is substantially shortcircuited (in other words, a low-impedance circuit is connected to the drain of the GaAs FET 10). It will be noted that the amplifier shown in FIG. 1 is designed taking into account the lead inductance L1 and the parasitic capacitance C1.

A choke coil 13 is coupled to the drain of the GaAs FET 10 via the bonding wire having the lead inductance L1. A drain bias voltage is applied to the drain of the GaAs FET 10 via the choke coil 13 and the lead inductance L1. It is necessary for the choke coil 13 to have a high impedance in the frequency range between the fundamental operating frequency and the third harmonic thereof. If this requirement is not satisfied, the above-mentioned short and open circuits will not be created, so that the second and third harmonics cannot be removed effectively. In order to meet the above requirement, the choke coil 13 must be formed of a lumped-constant circuit element, such as a coil obtained by turning a wire several times. In other words, the choke coil 13 cannot be formed of a distributed-constant circuit, such as a strip line. When the lumped-constant circuit element is used for forming the drain bias circuit, it is difficult to provide a compact, less expensive RF power amplifier.

SUMMARY OF THE INVENTION

It is a general object of the present invention to provide an improved high efficiency RF power amplifier in which the above-mentioned disadvantages are eliminated.

A more specific object of the present invention is to provide a compact, less expensive high efficiency RF power amplifier without a drain bias circuit element formed of a lumped-constant circuit element.

The above-mentioned objects of the present invention are achieved by a high efficiency RF power amplifier which includes a field effect transistor having a grounded source, a gate receiving an input signal, and a drain. A first inductor has a first end coupled to the drain via a lead inductance, and a second end via which an amplified output signal is output. A first capacitor has a first end grounded and a second end coupled to the second end of the first inductor. A second inductor has a first end receiving a drain bias voltage and a second end coupled to the second end of the first inductor. The second inductor is formed of a distributed-constant element. The first capacitor and the second inductor form a parallel resonance circuit coupled to the drain at a fundamental operating frequency of the high efficiency RF power amplifier, so that the drain is set to a high-impedance state. The first inductor, the first capacitor and the lead inductance form a serial resonance circuit coupled to the drain at a second harmonic of the fundamental operating frequency, so that the drain is set to a low-impedance state.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
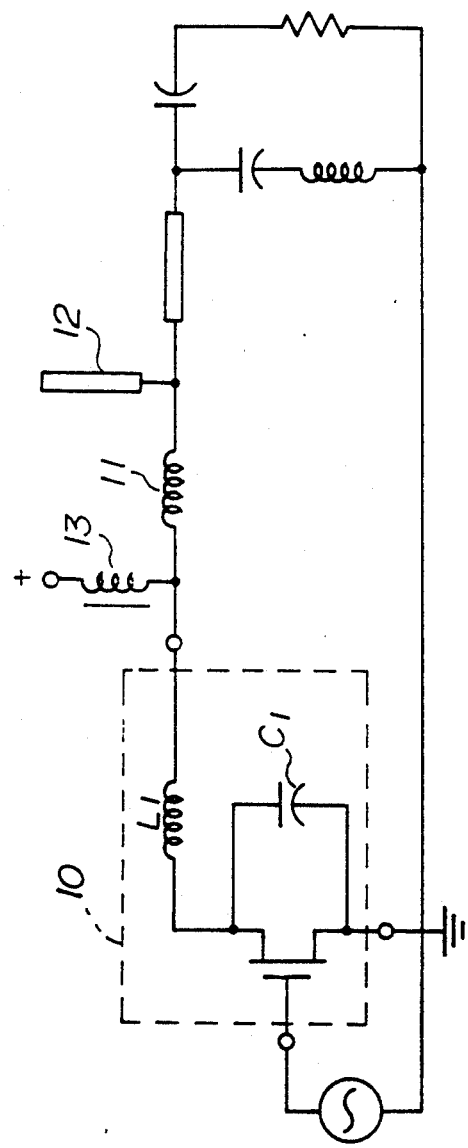
FIG. 1 is a circuit diagram of a conventional high efficiency RF power amplifier.
Figure 2:
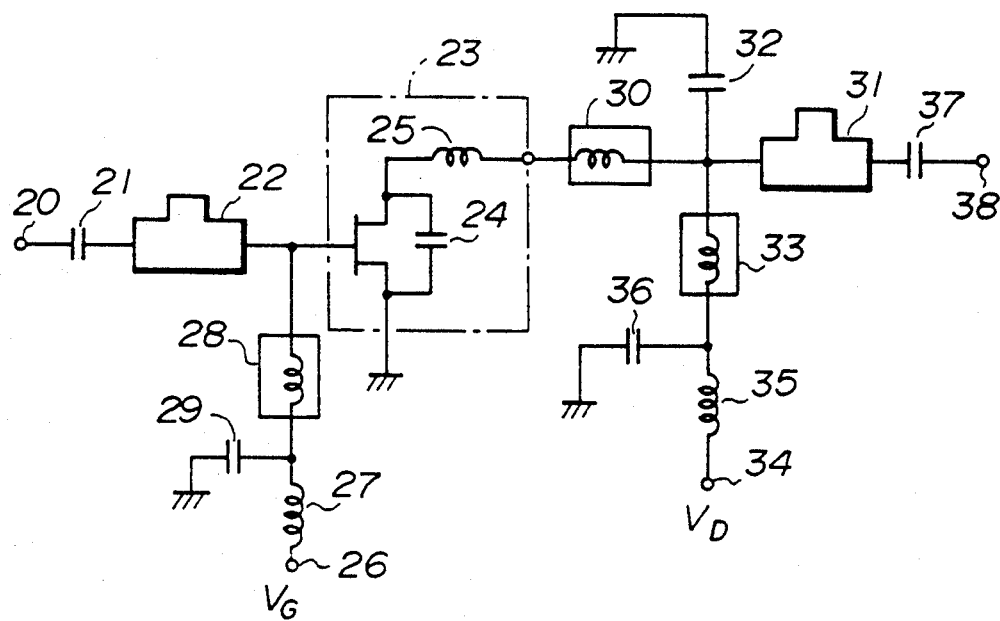
FIG. 2 is a circuit diagram of a high efficiency RF power amplifier according to a first preferred embodiment of the present invention.

FIG. 2 shows a high efficiency RF power amplifier according to the first preferred embodiment of the present invention. An RF input signal applied to a terminal 20 passes through a coupling capacitor 21, and is applied to an input matching circuit 22. Then, the input signal is applied to the gate of a GaAs FET 23. A D.C. gate bias voltage $V_G$ applied to a terminal 26 is input to the gate of the GaAs transistor 23 via a gate bias supply line 27 having a lead inductance, and an RF choke coil 28. The RF choke coil 28 is formed of a strip line, and has a length $\lambda_1/4$ where $\lambda_1$ is the wavelength of the fundamental wave having a frequency equal to, for example, about 900 MHz. A node where the gate bias supply line 27 is connected to the choke coil 28 is grounded via a capacitor 29, which allows high frequency components to pass.

Figure 7:
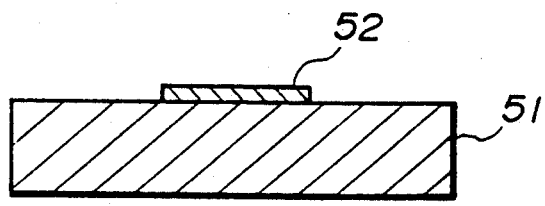
FIG. 7 is a cross-sectional view of a strip line.

The source of the GaAs FET 23 is grounded. The GaAs FET 23 has a parasitic capacitance 24 formed between the drain and source of the GaAs FET 23, and a lead inductance 25 of a bonding wire connected to the drain thereof. The drain of the GaAs FET 23 is coupled, via the lead inductance 25, to one end of an inductor 30 formed of a strip line as shown in FIG. 7, which is composed of a dielectric element 51 and a conductor 52. The other end of the inductor 30 is connected to a lowpass type output matching circuit 31, and grounded via a capacitor 32 formed of a lumped-constant circuit element. Further, the other end of the inductor 30 is connected to one end of an inductor 33 which is an element of a drain bias circuit. The output matching circuit 31 has a high efficiency at the fundamental operating frequency and a high impedance at the second harmonic thereof.

The inductor 33 is formed of a strip line having a length equal to or smaller than $\lambda_2/4$ where $\lambda_2$ is the wavelength of the second harmonic of the fundamental operating frequency. A D.C. drain bias voltage $V_D$ is applied to the other terminal of the inductor 33 via a terminal 34 and a drain bias supply line 35 having a lead inductance. A node where the inductor 33 is connected to the drain bias supply line 35 is grounded via a capacitor 36, which allows high frequency components to pass.

An amplified RF signal output by the GaAs FET 23 passes through the lead inductance 25, the inductor 30 and the output matching circuit 31, and is then output to an output terminal 38 via a coupling capacitor 37. The inductors 30 and 33 and the capacitor 32 are designed so that the amplifier can operate in the following way. At the fundamental operating frequency, a parallel resonance circuit comprising the capacitor 32 and the inductor 33 is created, so that a high-impedance circuit (open impedance circuit) is coupled to the drain of the GaAs FET 23. At the second harmonic of the fundamental operating frequency, a series resonance circuit comprising the lead inductance 25, the inductor 30 and the capacitor 32 is created, so that a low-impedance (short circuit impedance) is coupled to the drain of the GaAs FET 23 (in other words, the drain is substantially grounded).

It should be noted that the RF power amplifier shown in FIG. 2 can execute class F amplification when the drain of the GaAs FET 23 is shortcircuited at the second harmonic of the fundamental operating frequency even if the drain is not in the open state at the third harmonic thereof. The drain bias voltage $V_D$ is supplied to the drain of the GaAs FET 23 via the inductor 33. The inductor 33 forms the parallel resonance circuit together with the capacitor 32 at the fundamental operating frequency. The inductor 33 can be formed of a distributed-constant circuit, such as a strip line as shown in FIG. 7. With this arrangement, it is possible to provide the compact, less expensive drain bias circuit without any lumped-constant circuit element, such as a choke coil.

It is possible to design the inductors 30 and 33 and the capacitor 32 so that at the third harmonic a parallel resonant circuit comprised of the capacitor 24, the inductors 25, 30 and 33, and the capacitor 32 is created and thus a high-impedance circuit is coupled to the drain of the GaAs FET 23.

It should be noted that the capacitor 32 is designed so that the parallel resonant circuit is formed together with the inductor 33 at the fundamental operating frequency, and the inductor 33 is designed so that it has a length $\lambda_2/4$ where $\lambda_2$ is the wavelength of the second harmonic. Thus, the capacitor 32 and the inductor 33 have a small degree of freedom in design. Meanwhile, the inductor 30 has a large degree of freedom in design.

The capacitance of the capacitor 32, which forms the parallel resonant circuit together with the inductor 33 at the fundamental operating frequency, is determined as follows. The impedance of the drain bias circuit, $Z_l$, is described as follows:

$$Zl = j \cdot Rc \cdot \tan\beta l \qquad (1)$$

where Rc is the impedance of the drain bias supply line 35 (about 90 ohms, for example), $\beta = 2\pi/\lambda$, and $l = l2 = \lambda_2/4$ (l2 is the length of the inductor 33).

Formula (1) can be rewritten as follows:

$$\begin{aligned} Z_l &= j \cdot Rc \cdot \tan(2\pi/\lambda)(\lambda_2/4) \\ &= j \cdot Rc \cdot \tan(\pi/2)(\lambda_2/\lambda) \end{aligned} \qquad (2)$$

Since $\lambda = \lambda_1 = 2\lambda_2$, formula (2) can be rewritten as follows:

$$\begin{aligned} Z_l &= j \cdot Rc \cdot \tan(\pi/4) = j \cdot Rc \\ &= j \cdot 90 = j \cdot \omega_1 \cdot L = j \cdot 2\pi \cdot f_1 \cdot L \end{aligned} \qquad (3)$$

Thus, the following is obtained:

$$\begin{aligned} f_1 &= 1/(2\pi \sqrt{LC}) \\ &= 1/2\pi[\sqrt{(90/2\pi f_1)C}] \\ &= \sqrt{f_1}/\sqrt{2\pi \cdot 90 \cdot C} \end{aligned} \qquad (4)$$

By squaring both sides of the formula (4), the following is obtained:

$$f_1 = 1/(2\pi \cdot 90 \cdot C) \qquad (5)$$

For $f_1 = 920$ MHz, for example, $$C = 1.322 \text{ pF} \approx 2 \text{ pF} \qquad (6)$$

In order to reduce the area of the inductor 33 on an LSI chip, it is possible for the capacitor 32 to have a capacitance greater than 2 pF without degrading the amplification characteristics, such as 3 or 4 pF.

It will be noted that it is not necessary to consider the harmonics on the input side of the GaAs FET 23 since these harmonics arise from the operation of the GaAs FET 23.

Figure 3:
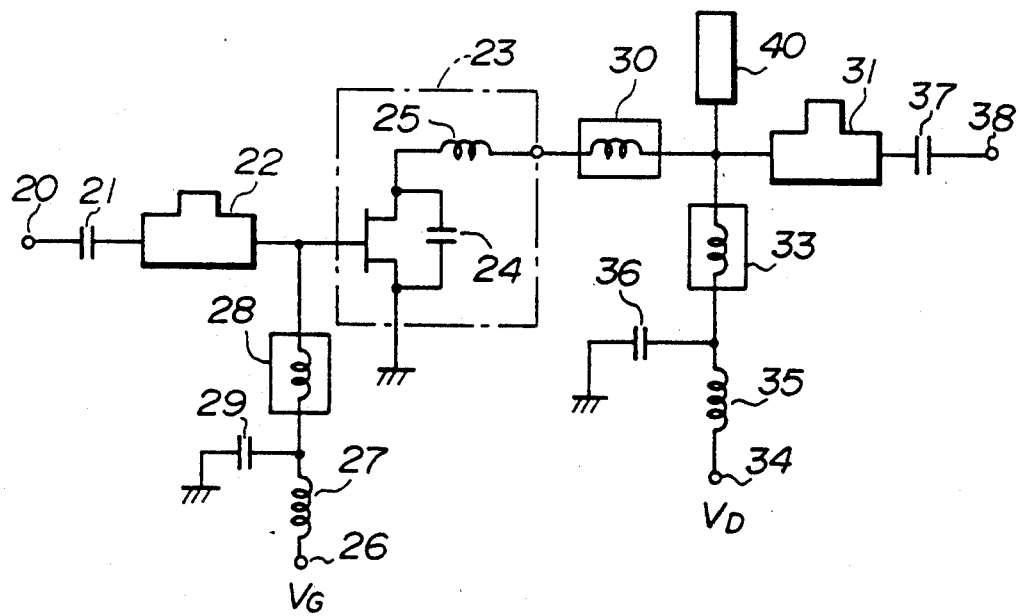
FIG. 3 is a circuit diagram of a variation of the circuit configuration shown in FIG. 2.

FIG. 3 is a variation of the first embodiment of the present invention shown in FIG. 2. A strip line 40, which is a distributed-constant element, is substituted for the capacitor 32. The strip line 40 has one end connected to the inductor 33 and the other end in the open state.

Figure 4:
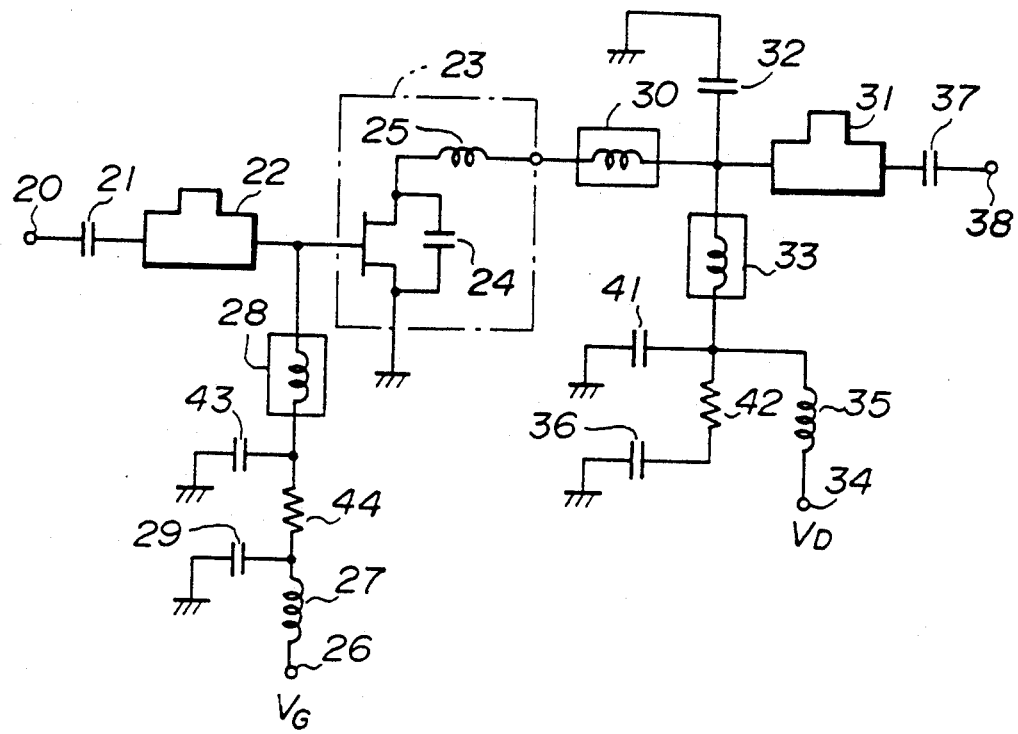
FIG. 4 is a circuit diagram of a high efficiency RF power amplifier according to a second preferred embodiment of the present invention.

FIG. 4 shows a high efficiency RF power amplifier according to the second preferred embodiment of the present invention. In FIG. 4, those parts which are the same as those shown in FIG. 2 are given the same reference numerals. The end of the inductor 33 which is connected to the drain bias supply line 35 is grounded via a capacitor 41, and connected to one end of a resistor 42. The other end of the resistor 42 is grounded via the aforementioned capacitor 36. In a similar way, the end of the inductor 28 which is on the side of the gate bias supply line 27 is grounded via a capacitor 43, and connected to one end of a resistor 44. The other end of the resistor 44 is grounded via the capacitor 29.

As has been described previously, the parallel resonant circuit composed of the inductor 33 and the capacitor 32 is created at the fundamental operating frequency. However, the inductors 33 and 28 do not have a sufficient impedance at frequencies lower than the fundamental operating frequency. According to the circuit configuration shown in FIG. 4, the impedances of the resistors 42 and 44 are at such frequencies lower than the fundamental operating frequency. Thus, it is possible to improve the operation stability of the amplifier so that the occurrence oscillation can be prevented. Each of the resistors 42 and 44 has a resistance equal to, for example, 50 ohms. In this case, the amplifier operates in a stable area in the Smith chart.

Figure 5:
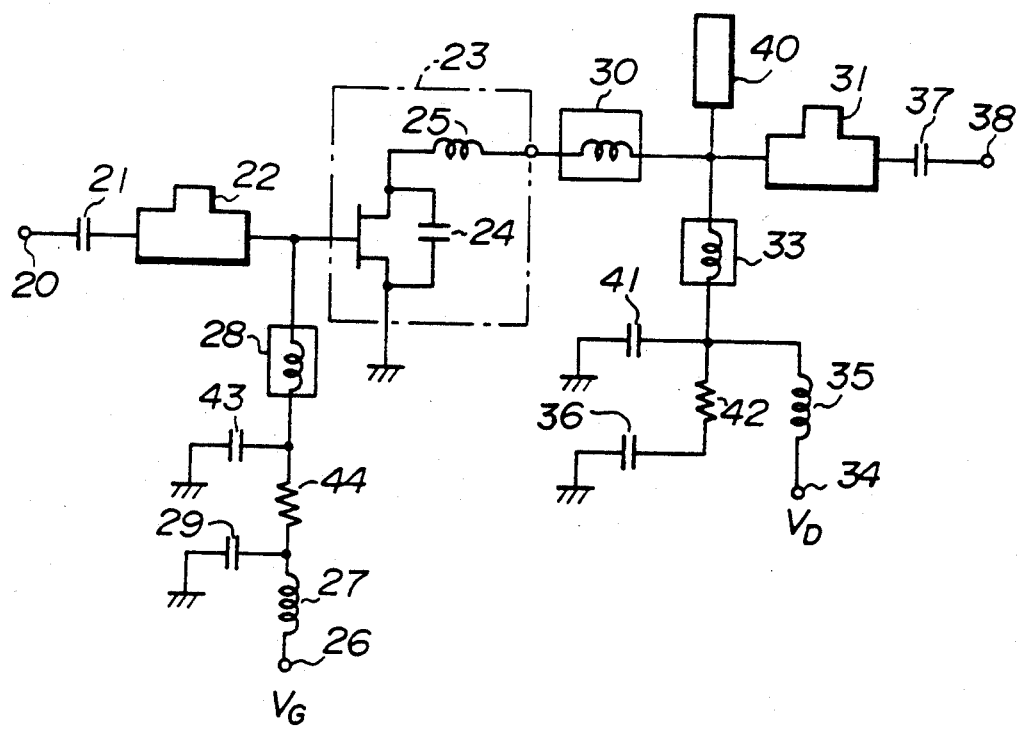
FIG. 5 is a circuit diagram of a variation of the circuit configuration shown in FIG. 4.

FIG. 5 illustrates a variation of the second embodiment of the present invention shown in FIG. 4. The capacitor 32 shown in FIG. 4 is replaced by the aforementioned strip line 40.

Figure 6A:
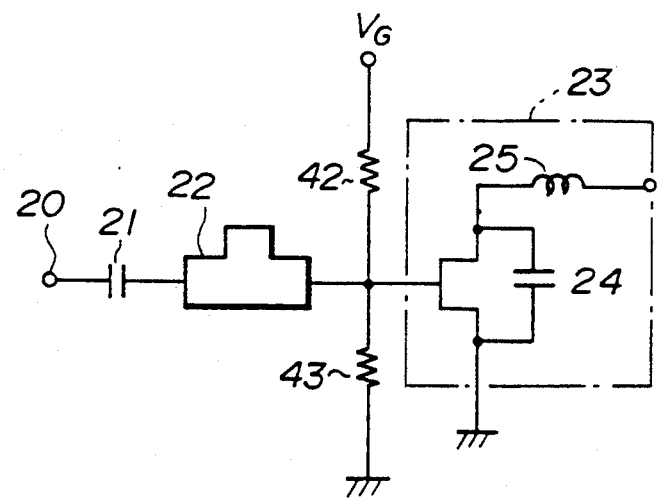
FIGS. 6A and 6B are circuit diagrams of variations of a gate bias circuit.

The gate bias circuit is not limited to the structures shown in FIGS. 2 and 4. As shown in FIG. 6A, the gate bias circuit is made up of resistors 42 and 43 connected in series. The gate bias voltage $V_G$ is applied to one end of the resistor 42, the other end thereof is connected to one end of the resistor 43. The other end of the resistor 43 is grounded. A voltage obtained by dividing the gate bias voltage $V_G$ is applied to the gate of the GaAs FET 23. With the 50-ohm system, each of the resistors 42 and 43 is designed to have a resistance much greater than 50 ohms, for example, 3 or 4 kilo-ohms. The RF input signal is not affected by the resistors 42 and 43 having such high resistance values.

Figure 6B:
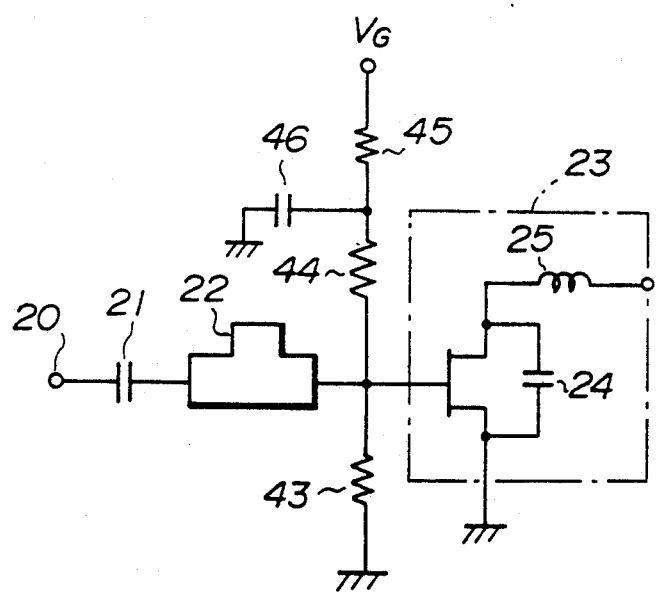

It is also possible to employ a gate bias circuit as shown in FIG. 6B, which is made up of resistors 45, 44 and 43 connected in series and a capacitor 46. A node where the resistors 44 and 45 are connected in series is grounded via the capacitor 46. As compared with the gate bias circuit shown in FIG. 6A, the gate bias circuit shown in FIG. 6B operates in a much more stable area in the Smith chart. For the 50-ohm system, the resistor 44 has a resistance of, for example, 100–300 ohms, and the capacitor 46 has a capacitance of, for example, 1000 pF.

The present invention is not limited to the specifically disclosed embodiments, and variations and modifications may be made without departing from the scope of the present invention.

What is claimed is:

1. A high efficiency RF power amplifier comprising:
    a field effect transistor having a grounded source, a gate receiving an input signal, and a drain;
    a first inductor having a first end coupled to the drain via a lead inductance, and a second end via which an amplified output signal is output;
    a first capacitor via which the second end of the first inductor is grounded; and
    a second inductor having a first end receiving a drain bias voltage and a second end coupled to the second end of said first inductor, said second inductor comprising a distributed-constant element,
    said first capacitor and said second inductor forming a parallel resonant circuit coupled to the drain at a fundamental operating frequency of said high efficiency RF power amplifier, so that the drain is set to a high-impedance state, and
    said first inductor, said first capacitor and said lead inductance forming a serial resonant circuit coupled to the drain at a second harmonic of the fundamental operating frequency, so that the drain is set to a low-impedance state.

2. A high efficiency RF power amplifier as claimed in claim 1, further comprising:
    a second capacitor; and
    a resistor having a first end coupled to the first end of said second inductor, and a second end grounded via said second capacitor.

3. A high efficiency RF power amplifier as claimed in claim 1, wherein said first capacitor comprises a lumped-constant circuit element having a first end coupled to the second end of said first inductor, and a second end grounded.

4. A high efficiency RF power amplifier as claimed in claim 1, wherein said first capacitor comprises a distributed-constant element having a first end coupled to the second end of said first inductor, and a second end which is in an open state.

5. A high efficiency RF power amplifier as claimed in claim 4, wherein said first capacitor comprises a strip line.

6. A high efficiency RF power amplifier as claimed in claim 1, further comprising a parallel resonant circuit created at a third harmonics of the fundamental operating frequency, said parallel resonant circuit comprising a parasitic capacitance coupled between the drain and source, said lead inductance, said first inductance, said first capacitor and said second inductor.

7. A high efficiency RF power amplifier as claimed in claim 6, wherein said first capacitor comprises a lumped-constant circuit element having a first end coupled to the second end of said first inductor, and a second end grounded.

8. A high efficiency RF power amplifier as claimed in claim 6, wherein said first capacitor comprises a distributed-constant element having a first end coupled to the second end of said first inductor, and a second end which is in an open state.

9. A high efficiency RF power amplifier as claimed in claim 8, wherein said first capacitor comprises a strip line.

10. A high efficiency RF power amplifier as claimed in claim 1, further comprising a second capacitor having a first end coupled to the first end of said second inductor, and a second end grounded.

11. A high efficiency RF power amplifier as claimed in claim 1, further comprising a third inductor having a first end receiving a gate bias voltage, and a second end coupled to the gate.

12. A high efficiency RF power amplifier as claimed in claim 11, further comprising:
    a second capacitor; and
    a resistor having a first end coupled to the first end of said third inductor, and a second end grounded via said second capacitor.

13. A high efficiency RF power amplifier as claimed in claim 11, further comprising a second capacitor having a first end coupled to the first end of said third inductor, and a second end grounded.

14. A high efficiency RF power amplifier as claimed in claim 1, further comprising:

a first resistor having a first end receiving a gate bias voltage, and a second end coupled to the gate; and a second resistor having a first end coupled to the gate, and a second end grounded.

15. A high efficiency RF power amplifier as claimed in claim 1, further comprising:

a first resistor having a first end receiving a gate bias voltage, and a second end;

a second resistor having a first end coupled to the second end of said first resistor, and a second end coupled to the gate;

a third resistor having a first end coupled to the gate, and a second end grounded; and a second capacitor having a first end coupled to the second end of said first resistor, and a second end grounded.

16. A high efficiency RF power amplifier as claimed in claim 1, wherein said second inductor having a length equal or smaller than $\lambda_2/4$ where $\lambda_2$ is a wavelength of the second harmonic.

* * * * *

UNITED STATES PATENT AND TRADEMARK OFFICE
CERTIFICATE OF CORRECTION

PATENT NO. : 5,159,287
DATED : October 27, 1992
INVENTOR(S) : Nagahisa FURUTANI et al.

It is certified that error appears in the above-indentified patent and that said Letters Patent is hereby corrected as shown below:

Col. 5, line 19, delete "the occurrence".

Signed and Sealed this

Twenty-sixth Day of July, 1994

Attest:

BRUCE LEHMAN

*Attesting Officer*   *Commissioner of Patents and Trademarks*